United States Patent [19]

Merrill

[11] 4,095,866
[45] Jun. 20, 1978

[54] HIGH DENSITY PRINTED CIRCUIT BOARD AND EDGE CONNECTOR ASSEMBLY

[75] Inventor: Peter S. Merrill, San Diego, Calif.

[73] Assignee: NCR Corporation, Dayton, Ohio

[21] Appl. No.: 798,505

[22] Filed: May 19, 1977

[51] Int. Cl.² .............................................. H05K 1/07
[52] U.S. Cl. ................. 339/17 E; 174/68.5; 339/17 L; 361/414
[58] Field of Search ............... 339/17 R, 17 B, 17 C, 339/17 E, 17 L, 176 MP; 174/68.5; 361/401, 414

[56] References Cited

U.S. PATENT DOCUMENTS

| | | | |
|---|---|---|---|
| 3,107,414 | 10/1963 | Sterling | 339/17 E |
| 3,160,455 | 12/1964 | Mayon et al. | 339/17 L |
| 3,221,095 | 11/1965 | Cook | 174/68.5 |
| 3,898,370 | 8/1975 | Davy et al. | 174/68.5 |

OTHER PUBLICATIONS

IBM Tech. Disc. Bulletin, Shea, vol. 9, No. 2, 7-1966, pp. 148, 149.

*Primary Examiner*—Neil Abrams
*Attorney, Agent, or Firm*—J. T. Cavender; Edward Dugas; Stephen F. Jewett

[57] ABSTRACT

A high density printed circuit board carrying integrated circuits or the like is provided with two parallel rows of terminals along one edge on both sides of the board. The terminals in the outer row of terminals closest to the edge of the board are connected to printed circuits on inner layers of the multiple layer printed circuit board by plated-through holes or other suitable techniques; and the printed circuits on the outer layer or layers are connected to the inner row of terminals spaced just inside the outer row of terminals. A circuit board connector is provided with spring contacts which are electrically insulated from one another but which are designed to engage the multiple layer printed circuit board at the position of the first and second rows of terminals. The spring contacts engaging the inner row of terminals on the circuit board are longer in length than those engaging the outer row of terminals, and are thus easily deflected so that the P.C. board may be inserted or removed from the connector without excessive force.

11 Claims, 5 Drawing Figures

HIGH DENSITY PRINTED CIRCUIT BOARD AND EDGE CONNECTOR ASSEMBLY

BACKGROUND OF THE INVENTION

This invention relates to high density printed circuit boards and their terminals, and associated connector assemblies.

Edge type connector assemblies are well known in the electronics field. A typical edge connector and printed board assembly is shown for example in Frank E. Cooney U.S. Pat. No. 3,660,803 titled, "Electrical Connectors", granted May 2, 1972 and assigned to the assignee of the present invention; and an edge type connector and printed circuit board assembly using two rows of terminals along one edge of the board and matching spring contacts is shown in L. Mayon et al, U.S. Pat. No. 3,160,455, granted Dec. 8, 1964. Additional printed circuit board showings employing two rows of terminals are shown in IBM Technical Disclosure Bulletins entitled, "Connector for Multilayer Circuit Package" by R. C. Miller, Vol. 15, No. 5, October 1972, pages 1614 and 1615; and "High Density Circuits Connector" by M. Jensen et al, Vol. 13, No. 6, November 1970.

It may be noted in passing that two of the last three cited references show inner and outer rows of terminals in which surface connections extend between the inner row of terminals to the outer row of terminals. This configuration necessarily increases the spacing between terminals of the inner row or makes for close printed circuit tolerances, or both.

Additional patents which are related to the disclosure of the present specification include the following:
U.S. Pat. No. 3,015,083, entitled "Electrical Connectors", by Juris;
U.S. Pat. No. 3,328,749, entitled "Terminal", by Kukla;
U.S. Pat. No. 3,530,422, entitled "Connector and Method For Attaching Same to Printed Circuit Board", by Goodman;
U.S. Pat. No. 3,253,246, entitled "Printed Circuit Card Connector", by McConnell et al.;
U.S. Pat. No. 3,614,706, entitled "Ground Connector", by Kukla;
U.S. Pat. No. 3,671,917, entitled "Printer Circuit Board Connector", by Ammon et al.;
U.S. Pat. No. 3,673,548, entitled "Printed Circuit Board Connector", by Mattingly, J., et al.;
U.S. Pat. No. 3,744,005, entitled "Zero Force Type Connector Block", by F. C. Sitzler;
French Pat. No. 1,475,962, by Labinal.

Accordingly, in view of the foregoing background, one object of the present invention is to improve the construction of high density printed circuit boards, and associated edge connector assemblies.

SUMMARY OF THE INVENTION

In accordance with one aspect of the invention, the multilayer printed circuit boards may be provided with two rows of terminals along one edge of the board. These two rows of terminals, one immediately adjacent the edge and one spaced slightly back from the edge of the printed circuit board serve to make all of the necessary connections to the complex circuit board, and may be provided on both sides of the board. Preferably, the inner layers of the circuit board are connected to the outer row of terminals, and the outer layers of the multilayer board may be connected to the inner row of terminals.

With regard to the printed circuit board, the connections may be made by plated-through holes which may extend substantially all the way through the multilayer board, or may extend only from the inner layers in one direction or the other to the outer surface of the board.

Another aspect of the invention involves the mating edge board connector which includes a housing for guiding and locating the printed circuit board as it is mounted into place, and two sets of spring type conducting metal connector strips. One of the sets of conductor strips engages the terminals which are closest to the edge of the printed circuit board and another longer set of connector strips engages the set of terminals which is spaced inwardly from the edge of the printed circuit board. By the use of one set of longer connector strips, the required insertion and removal force is reduced.

Other objects, features and advantages of the invention will become apparent from a consideration of the following detailed description and from the accompanying drawings.

DETAILED DESCRIPTION

Figure 1:
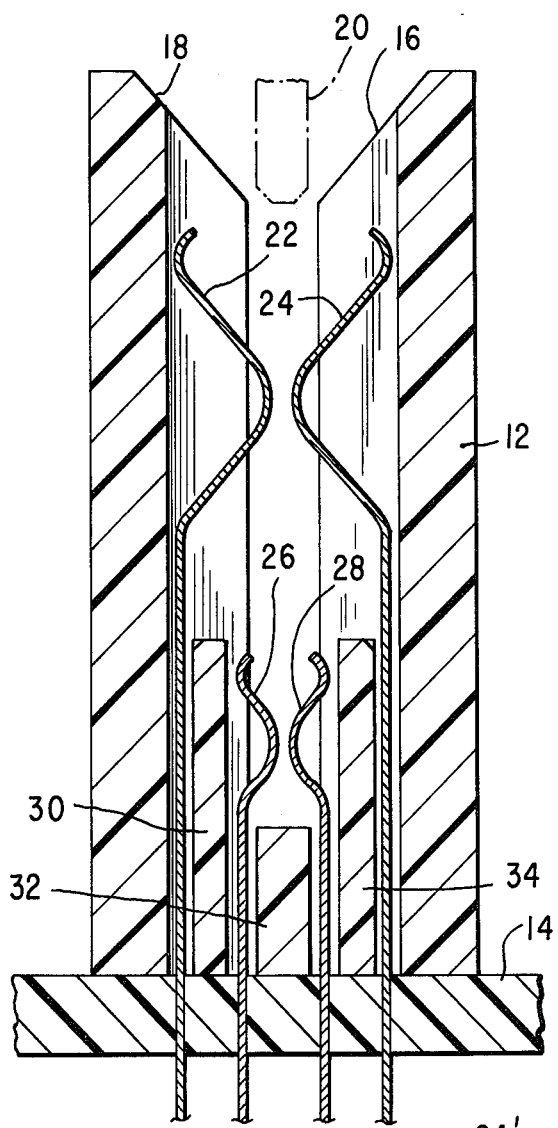
FIG. 1 is a cross-sectional view of a high density edge type connector for use with a mating high density printed circuit board.

Referring more particularly to the drawings, FIG. 1 shows a novel high density edge type connector constructed in accordance with a preferred embodiment showing one aspect of the present invention. As shown, a connector housing 12 is mounted on a back panel 14. The front end of the housing 12 is preferably provided with tapered or beveled surfaces 16 and 18 to facilitate sliding the high density printed circuit board 20 into the housing and into engagement with the resilient contacts 22, 24, 26 and 28.

It may be noted that the contacts 22, 24, 26 and 28 are preferably curved so that they make firm engagement with the printed circuit board 20 as it is slid into the housing 12. More specifically, they present slanted surfaces toward the board 20 so that the contacts are readily separated and then they exert significant resilient force onto the board 20 to physically hold it in place, and also to insure adequate contact pressure against the terminal pads on the printed circuit board 20 so that good electrical contact is made and maintained. Following engagement of the contacts with the terminals on the board 20, the contacts 22, 24, 26 and 28 have their curved inwardly-directed portions tangent with the terminals which they engage. The spring contacts 22, 24, 26 and 28 are insulated from one another and mounted in position by the insulating portions 30, 32, and 34 of the housing 12 and by the back panel 14.

Incidentally, the greater length of the spring contact members 22, 24 reduces the force required for insertion of the board 20, but the backing for the springs provided by housing 12 insures adequate final contact force.

Figure 2:
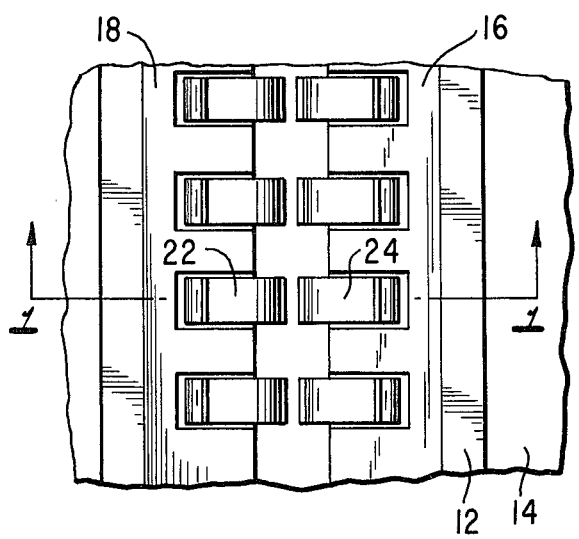
FIG. 2 is a fragmentary top view of the connector assembly of FIG. 1.

FIG. 2 is a top view of the assembly of FIG. 1. Clearly shown in FIG. 2 is the housing 12, the slanted surfaces 16 and 18, and the springs 22 and 24.

The cross-sectional view of FIG. 1 is taken along Section 1—1 of FIG. 2.

It is noted in passing that the exact shape of each of the contacts and their mode of mounting and the like can take any known form, as indicated for example in the above-cited U.S. Pat. No. 3,660,803, assigned to the assignee of the present invention.

Figure 3:
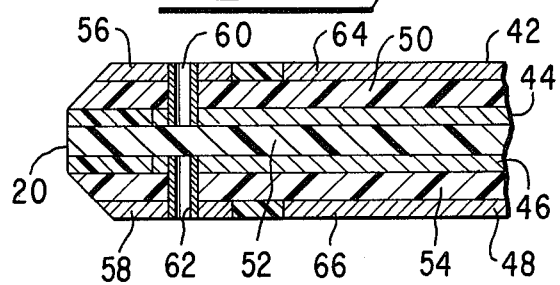
FIG. 3 is a schematic cross-sectional view of one edge of a multilayer circuit board which may be used with the connector of FIGS. 1 and 2.

FIG. 3 is a partial cross-sectional view of the multilayer printed circuit board 20 shown in FIG. 1 as being assembled to the connector. FIG. 3, as drawn, has an increased scale in the vertical direction. Thus, the normal printed circuit board has very closely spaced conductive and insulating layers and these are shown to a greatly expanded scale in FIG. 3. More specifically, the four conductive patterns are shown in the multilayer board of FIG. 3 and these include the conductive patterns 42, 44, 46 and 48. These are separated by the insulating printed circuit board layers 50, 52, and 54. In the arrangement shown in FIG. 3 the terminals 56 and 58 are part of the rows on either side of the printed circuit board which are closest to the edge of the board 20. In addition, in accordance with one embodiment of the present invention, terminal 56 is connected by the plated-through hole 60 to the inner layer 44, while terminal 58 is connected by the plated-through hole 62 to the conductive pattern 46. Terminals 64 and 66 are part of the next row of terminals which are spaced inwardly from the outer rows adjacent the edge of the printed circuit board 20 and on opposite sides thereof.

Figure 4:
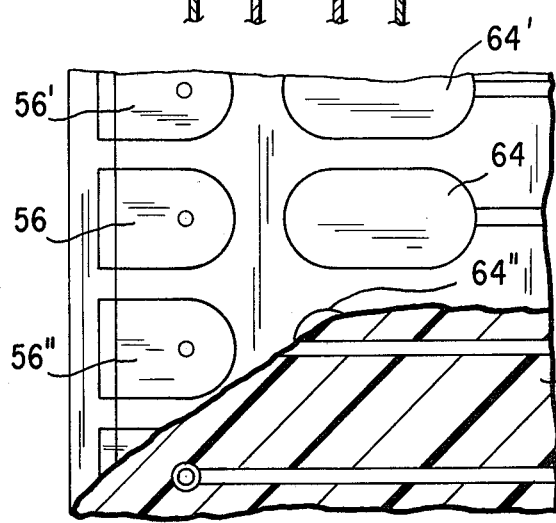
FIG. 4 is a fragmentary top view of the edge of the printed circuit board of FIG. 3.

In FIG. 4 a fragmentary top view of the board 20 is shown. As shown in this figure, the terminals 56, 56' and 56" form part of the row of terminals along the edge of the printed circuit board 20, while the terminals 64, 64' and 64" form a part of the next row of terminals along the edge but spaced back from the edge for engagement by the contacts such as contact 24 as shown in FIG. 1.

Figure 5:
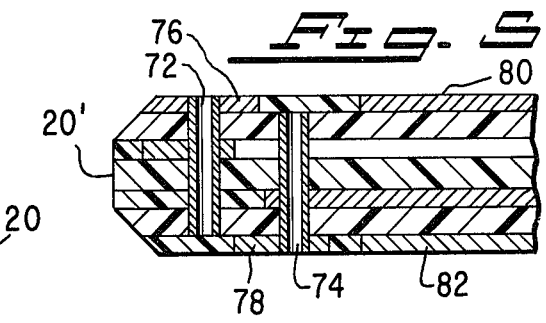
FIG. 5 is a cross-sectional view of an alternative form of multilayer printed circuit board.

FIG. 5 shows an alternative printed circuit board 20' in which plated-through holes 72 and 74 extend substantially all the way through the printed circuit board instead of merely extending from intermediate boards to the surface in accordance with the arrangement shown in FIG. 3. This arrangement shown in FIG. 5 provides staggered terminals, with terminal 76 associated with plated-through hole 72 being closer to the edge of the board than terminals 78 associated with plated-through hole 74. The use of plated-through holes which extend all or substantially all the way through the printed circuit board facilitates production operations, in some cases. It may also be noted of course that, using the arrangement of FIG. 5, the contacts 26 and 28 might have to be shifted somewhat in their engagement points with the terminals on opposite sides of the printed circuit board; alternatively, terminals 76 and 78, for example, could be of sufficient extent that contacts 26, 28, for example, could both be of the same length, despite the slightly different positioning of the terminal pads on opposite sides of the board.

With regard to FIG. 5, the inner rows of terminals of board 20' include on one side terminals 80, and on the other side terminal 82. As in the case of the board of FIGS. 3 and 4, one set of terminals may be employed to make connections for the inner layers of the multilayer circuit board, while the other, inner pair of rows of terminals spaced further from the edge of the board 20' may be connected to the circuits on the outermost layers of the multilayer printed circuit board.

In the board of FIG. 5, as well as that of FIGS. 2 and 3, simplification of the circuit pattern is achieved by using the outer row of terminals for the inner layers, and the inner row of terminals are preferably coplanar with and are formed concurrently with the conductive pattern on the outer printed circuit board layers.

It is to be understood that minor departures from the foregoing specific details may be employed in the implementation of the present invention. Thus, while having a special applicability to multilayer circuit boards, the present invention is not so limited. Also, although the spring contact arrangements as shown in FIGS. 1 and 2 are preferred, other known spring contact engagement arrangements may be employed without departing from the spirit and scope of the invention.

What is claimed is:

1. A high density printed circuit board and edge connector assembly comprising:

a high density printed circuit board having a printed circuit pattern on said board and a printed circuit pattern within said board;

a first row of terminals located on said board adjacent one edge of said printed circuit board;

a second row of terminals located on said board coplanar with said first row of terminals and spaced back from said edge further than said first row of terminals;

connections to said first and second rows of terminals consisting of conductor means extending from said printed circuit pattern within said board to terminals in said first row and extending from said printed circuit pattern on said board to terminals in said second row; and an edge type circuit board connector including a housing for receiving and positioning said board, and first and second sets of spring type electrical contact means located to engage said first and second rows of terminals respectively.

2. A high density connector as defined in claim 1 wherein said first spring contact means are substantially shorter than said second spring contact means.

3. A high density connector as defined in claim 1 wherein each of said contact means includes a curved conductor strip and means are provided for mounting each said conductor strip to engage a different circuit board terminal along a tangent to said curved strip.

4. A high density assembly as defined in claim 1 wherein said printed circuit board is a multilayer printed circuit board and wherein plural printed circuit patterns, including said printed circuit pattern within said board, are located on inner layers of said board.

5. A high density assembly as defined in claim 4 wherein said conductor means includes plated-through holes interconnecting selected printed circuit patterns on inner layers of said multilayer printed circuit board with selected terminals included in said first row of terminals.

6. A high density assembly as defined in claim 5 wherein said plated-through holes are connected to said first row of terminals, to minimize cross-over connections.

7. A high density assembly as defined in claim 5 wherein said plated-through holes extend substantially all of the way through said printed circuit board.

8. A high density assembly as defined in claim 7 wherein first and second sets of said plated-through holes are provided at respectively different distances from said edge of said board, two rows of terminals are located on both sides of said printed circuit board along one edge thereof, and wherein the row of terminals adjacent the edge of said board on one side are located a predetermined distance from said edge and are in electrical contact with said first set and are isolated from said second set of plated-through holes, and wherein the row of terminals adjacent the edge of said board on the other side of said board is located at a different distance from the edge of said board and are in electrical contact with said second set and are isolated from said first set of plated-through holes.

9. A high density assembly as defined in claim 5 wherein said plated-through holes only extend to one of the side surfaces of said printed circuit board.

10. A high density assembly as defined in claim 5 wherein said two rows of terminals and said conductive printed circuit pattern on said board all lie in substantially the same plane.

11. A multilayer printed circuit board and edge connector assembly comprising:

a multilayer printed circuit board having inner and outer layers and printed circuit patterns associated with said layers;

first and second parallel rows of terminals located on one outer layer and adjacent one edge of said board and coplanar with the printed circuit pattern associated with said one outer layer, said second row spaced back from said edge further than said first row and connected to the printed circuit pattern associated with said one outer layer;

connections to said first row of terminals consisting of conductive plated-through holes extending from the inner layers of said board and interconnecting the printed circuit patterns associated with said inner layers to terminals in said first row;

an edge type circuit board connector, including a housing for receiving and positioning said board, a first set of elongated resilient contacts deflectable by the insertion of said board for engagement with said first row of terminals, and a second set of elongated resilient contacts overlying and insulated from said first set of contacts and also deflectable by the insertion of said board for engagement with said second row of terminals, said second set of contacts being substantially longer and requiring less initial force for deflection than said first set of contacts whereby the insertion and removal force for said board is not excessive.

* * * * *